US006833557B1

(12) United States Patent
Ryan et al.

(10) Patent No.: US 6,833,557 B1
(45) Date of Patent: Dec. 21, 2004

(54) INTEGRATED CIRCUIT AND A METHOD OF MANUFACTURING AN INTEGRATED CIRCUIT

(75) Inventors: Vivian Wanda Ryan, Washington, NJ (US); Thomas Herbert Shilling, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/604,519

(22) Filed: Jun. 27, 2000

(51) Int. Cl.[7] .......................... H01L 29/10; H01L 29/40; H01L 23/48; H01L 23/52; H01L 23/58
(52) U.S. Cl. ........................ 257/48; 257/773; 257/775; 257/786
(58) Field of Search .................. 257/48, 773, 775, 257/786

(56) References Cited

U.S. PATENT DOCUMENTS 5,563,445 A * 10/1996 Iijima et al. ................ 257/398
5,726,491 A * 3/1998 Tajima et al. .............. 358/1.18
5,811,874 A * 9/1998 Lee
6,201,308 B1 * 3/2001 Ikegami et al.

* cited by examiner

Primary Examiner—David E. Graybill

(57) ABSTRACT

An apparatus and process to assess the occurrence or the likelihood of a failure in an integrated circuit. The process includes forming a conductive region such as a runner about the periphery of a substrate or die. The conductive regions may be located at one of more different metallization layers within the integrated circuit. The conductive region is couple to one or more of the bond pads. The die is assessed by measuring the resistance, conductivity, cross talk or other electrical characteristics on the conductive region via the bond pads. The assessment can then be used to predict whether, for example, the runners formed in the integrated circuit have failed or are likely to fail.

11 Claims, 3 Drawing Sheets

ND A METHOD OF
INTEGRATED CIRCUIT AND A METHOD OF MANUFACTURING AN INTEGRATED CIRCUIT

FIELD OF THE INVENTION

The present invention relates generally to integrated circuits and packaging and, more particularly, to providing mechanisms and methods to assess an integrated circuit.

BACKGROUND OF THE INVENTION

Integrated circuits are typically fabricated with multiple levels of patterned metallization electrically separated by interlayer dielectrics that contain vias at selected locations to provide electrical connections between the patterned metallization layers. As integrated circuits are scaled to smaller dimensions in a continual effort to provide increased performance (e.g., by increasing device speed and providing greater circuit functionality within a given area chip), the interconnect line width dimension becomes increasingly narrow and the number of metal levels increases. This renders them more susceptible to deleterious effects such as fracture induced by delamination of mold compound and stress migration. Stress migration refers to mass transport of the interconnect material in response to mechanical stress gradients present in the interconnects which result from thermal expansion coefficient mismatches and compliance mismatches between the conductive runners and surrounding (e.g., overlying and/or underlying) dielectric materials or mold compounds.

Depending on the thermal history, the stress may be either compressive or tensile. Tensile stress can cause void formation, whereas compressive stress can cause hillock formation. Voids continue to grow to reduce the stress until it is energetically unfavorable for them to continue to grow, and migrating voids may also coalesce with other voids thus providing an effective void growth mechanism. For instance, consider the process of depositing an interlayer dielectric over an aluminum (Al) line (often termed "runner") which rests on a substrate or other dielectric material overlying a semiconductor substrate. Typically, such deposition is performed by chemical vapor deposition (CVD). After deposition, as the structure cools toward room temperature, the aluminum line, having a thermal expansion coefficient much greater than the interlayer dielectric, wishes to contract more than the overlying interlayer dielectric.

The interlayer dielectric, which has very good adhesion to the aluminum layer, prevents the aluminum line from contracting to its desired equilibrium length, thus resulting in a tensile stress in the aluminum line. The tensile stress is greatest at the edges of the line and decreases toward the center; hence there is a non-zero tensile stress gradient across the width of the line. This stress gradient corresponds to a chemical potential gradient that represents a thermodynamic driving force for mass transport. Accordingly, aluminum atoms diffuse to reduce the overall strain energy in the aluminum line. Over time, typically many months or several years, this mass transport of the conductive layer generates voids in the conductive runners that can lead to failure. The voids may entirely traverse the line (i.e., open circuit), or may reduce the cross-sectional area through which current may be conducted such that electrornigration effects are exacerbated and/or current conduction causes a catastrophic thermal failure event.

Essential to assessing the stress migration properties of conductive runners, is a method for evaluating these effects. Particularly, such methods should ri provide a mechanism that provides easy assessment of potential stress problems.

SUMMARY OF THE INVENTION

The present invention is directed to an apparatus and process to assess the occurrence or the likelihood of a failure in an integrated circuit. The process includes forming a conductive region such as a runner about the periphery of a substrate or die. The conductive region may be located at one or more different metallization layers within the integrated circuit. The conductive region is coupled to one or more of the bonds pads. The die is assessed by measuring the resistance, conductivity, cross talk or other electrical characteristics on the conductive region via the bond pads. The assessment can then be used to predict whether, for example, the runners formed in the integrated circuit have failed or are likely to fail.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

Briefly, the illustrative embodiment of the present invention provides an apparatus and process to assess the occurrence or the likelihood of a failure in an integrated circuit. The process includes forming a conductive region such as a runner about the periphery of a substrate or die. The conductive region may be located at one or more different metallization layers within the integrated circuit The conductive region is coupled to two or more of the bonds pads. The die is assessed by measuring the resistance, conductivity, cross talk or other electrical characteristics on the conductive region via the bond pads. The assessment can than be used to predict whether, for example, the runners formed in the integrated circuit have failed or are likely to fail.

Figure 1:
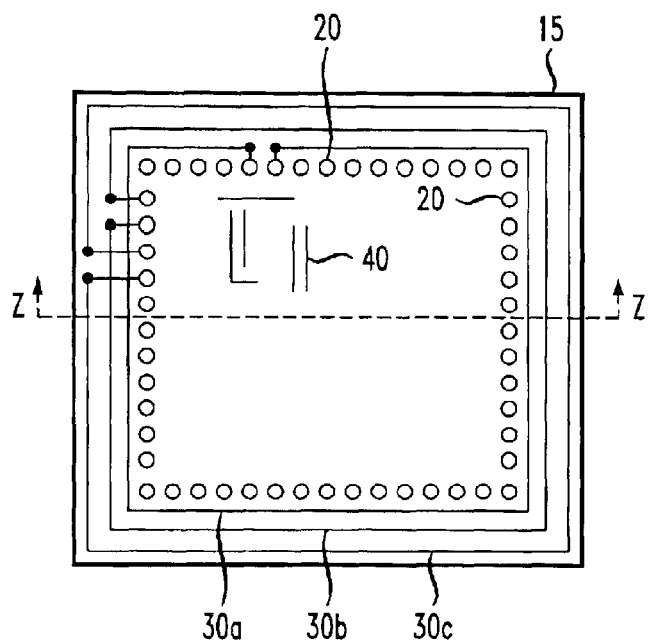
FIG. 1 is a top view of an integrated circuit in a state of partial manufacture according to an illustrative embodiment of the present invention.
Figure 2:
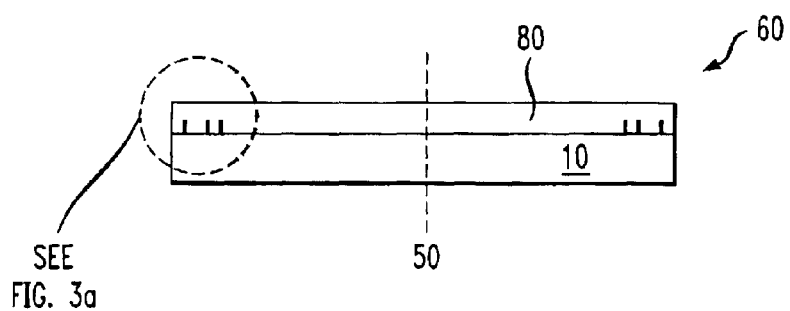
FIG. 2 is a schematic diagram of the integrated circuit shown in FIG. 1 along line 2—2.

Referring now to the drawing, wherein like reference numerals refer to like elements throughout, FIG. 1 is a top view of a die or substrate 10 according to the present invention. FIG. 2 is schematic diagram of the integrated circuit shown in FIG. 1 along line 2—2. The die 10 includes bond pads 20 and conductive regions 30a, 30b, and 30c. The conductive regions 30a, 30b, and 30c may be formed from a conductive material such as a metal, a metal alloy, a conductive silicide, a conductive nitride, a conductive organic polymer, or combinations thereof. The metals may include copper, aluminum, tungsten, titanium, or combinations thereof. The bond pads 20 may be formed in a star burst, square, rectangle, circle, or other shape.

Further, the material for the conductive regions 30a, 30b, and 30c may be selected to be the same as or substantially the same as the materials forming the conductive regions 40. The conductive regions 30a, 30b, and 30c may be formed when the conductive 40 regions are formed. Conductive regions 40 are, for example, runners or inter-level interconnects (e.g., plugs) for interconnecting devices formed in the die 10. In other words, conductive regions 40 are used to interconnect the structures in the die 10 to form an integrated circuit.

Typically, stresses associated with the manufacturing process to form integrated circuits are expressed to a greater extent at the periphery of a die. For example, the stress exerted on the die increases from the center of the die 50 towards the outer region 60. As described above, this occurs because of mismatches between the materials used to form the conductive regions 30a, 30b, 30c, and 40 and other materials forming the integrated circuit. The other materials include the inter-level dielectrics, mold compounds, and the substrate or die 10.

The conductive regions 30a, 30b, and 30c may be located in an number of areas relative to the die. For example, the conductive regions 30a, 30b, and 30c may be formed at the periphery or outer area of the die. Alternatively, the conductive regions 30a, 30b, and 30c may be formed between the outer edge of the die 10 and the bond pads 20. In another embodiment, the conductive regions 30a, 30b, and 30c may be formed closer to the outer edge 15 than the conductive regions 40. The conductive regions 30a, 30b, and 30c may also be positioned so that they experience forces equal to or greater than the forces exerted on the conductive regions 40 and are coupled to the bond pads 20 for ease of testing. In a further alternative embodiment, at least one of the conductive regions 30a, 30b, and 30c may be formed on the die 10 or other layer and connected to at least two bonds pads that may be used during the testing of the conductive region.

The different rates of expansion cause stress between one or all of the die, a mold compound 80 formed on the die, an inter-level dielectric (not shown), and the conductive regions. These stresses may cause the conductive regions to fail. The largest amount of stress should be exerted on the conductive regions 30a, 30b, and 30c because they are formed towards the outer region 60 of the die 10. As a result, the conductive regions 30a, 30b, and 30c are more likely to fail because a greater amount of stress is exerted on the conductive regions 30a, 30b, and 30c. Accordingly, failure of the conductive regions 30a, 30b, and 30c may be used to predict failure of the conductive regions 40. Thus, a determination that conductive regions 30a, 30b, and 30c have failed or are likely to fail may be used to reject the die 10 or require that the die 10 undergo more extensive tests to determine whether the die 10 should be rejected.

The bond pads 20 and the conductive regions 30a, 30b, and 30c may be formed on the same metallization layer or on different metallization layers. In the later case, the bond pads may be interconnected with conductive regions using plugs.

Failure of the conductive regions 30a, 30b, and 30c may be determined by measuring changes in the electrical characteristics of the conductive regions using well known techniques. For example, resistance or changes in resistance over time may be measured for the conductive regions 30a, 30b, and 30c. The conductance of the conductive regions 30a, 30b, and 30c may be measured. The occurrence of cross talk between two or more of the conductive lines may be measured. These are exemplary tests. Anyone of a number of known tests for evaluating conductive materials may be used.

In addition to measuring the electrical characteristics of the conductive regions, the die may be subjected to thermal, electrical, and/or other stresses to induce failure of the conductive regions. In this way, the measured electrical characteristics of the conductive regions may be used to predict the likelihood of failure of the conductive runners 40 or the likelihood that the conductive runners will fail within a certain specified time or under certain conditions. In other words, the conductive regions may be used to assess aspects of the integrated circuits performance during stress testing. This may allow for more rapid and reduced cost testing to determine the effects of stress on conductive regions formed in the integrated circuit.

The electrical characteristics of the conductive regions are measured by electrically coupling the bond pads 20 that are coupled to the conductive regions 30a, 30b, and 30c to a tester 300 (see FIG. 6) using probes 305 (see FIG. 6) or other suitable means for forming an electrical connection between the bond pads 20 and the tester 300 for evaluating the conductive regions. Testing may be performed at a number of different points during the manufacture of the die 10. These include before or after the formation of (1) one or more dielectric layers, (2) a passivation layer, or (3) a molding compound, on the die 10. Each of these layers or processes for forming these layers may induce stresses on the conductive regions 30a, 30b, 30c, and 40. Once an electrical test assessment has been performed on one or more of the dies 10, the data may be used to reject or accept the lot from which the dies(s) 10 have been selected for testing. Alternatively, each of the dies 10 may be tested given the potential ease and low cost testing enabled by the illustrative embodiment.

Figure 3A:
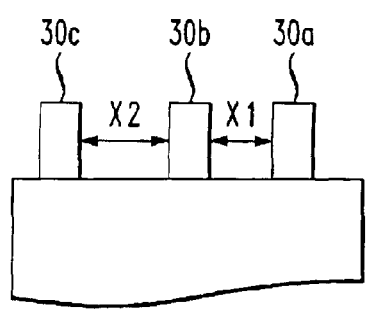
FIGS. 3a and 3b are exploded views of a segment of the integrated circuit shown in FIG. 2.
Figure 3B:
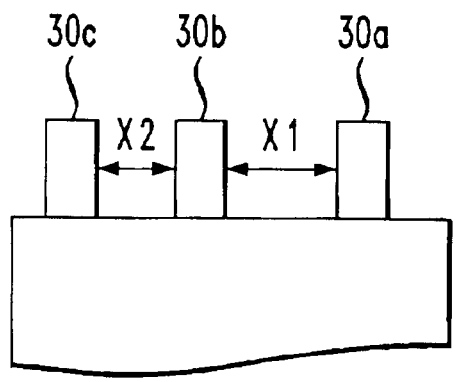

As shown in FIGS. 3a and 3b, the spacing between the conductive regions 30a, 30b, and 30c may be varied to assess stress effects across different regions of the die 10. For example, the spacing X1 between conductive regions 30a and 30b may be less than the spacing X2 between conductive regions 30b and 30c. As a result, the deleterious effects of stresses on closely spaced conductive regions (e.g., runners or interconnects) may be detected. While FIG. 3a illustrates that the spacing X1 is greater than X2, this may be reversed (see FIG. 3b) so that the spacing X2 is greater than X1. Three conductive regions 30a, 30b, and 30c are shown for illustrative purposes, however, one or more conductive regions may be included on the die. For example, one conductive region 30 or five conductive regions 30 may be formed on the die 10.

Figure 4:
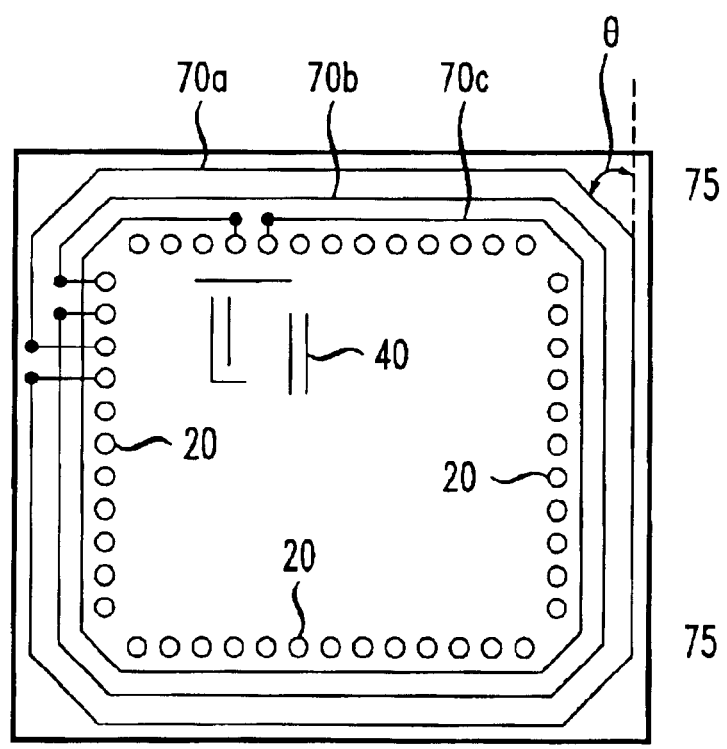
FIG. 4 is a top view of the integrated circuit according to another illustrative embodiment of the present invention.

FIG. 4 illustrates an alternative embodiment of the present invention. In FIG. 4, corner regions 75 of the conductive regions 70 have a 45 degree ($\theta$ is 45°) chamfer so the stresses that radiate from the center 50 of the die towards the corners of the die are substantially perpendicular to the corner regions 75. In this way, the amount of hoop stress on the long axis of the conductive regions 70 in the corner regions 75 is increased. $\theta$ may be between 0° and 90°. The conductive regions 70 are assessed using the same process discussed above with regard to FIG. 1.

Figure 5:
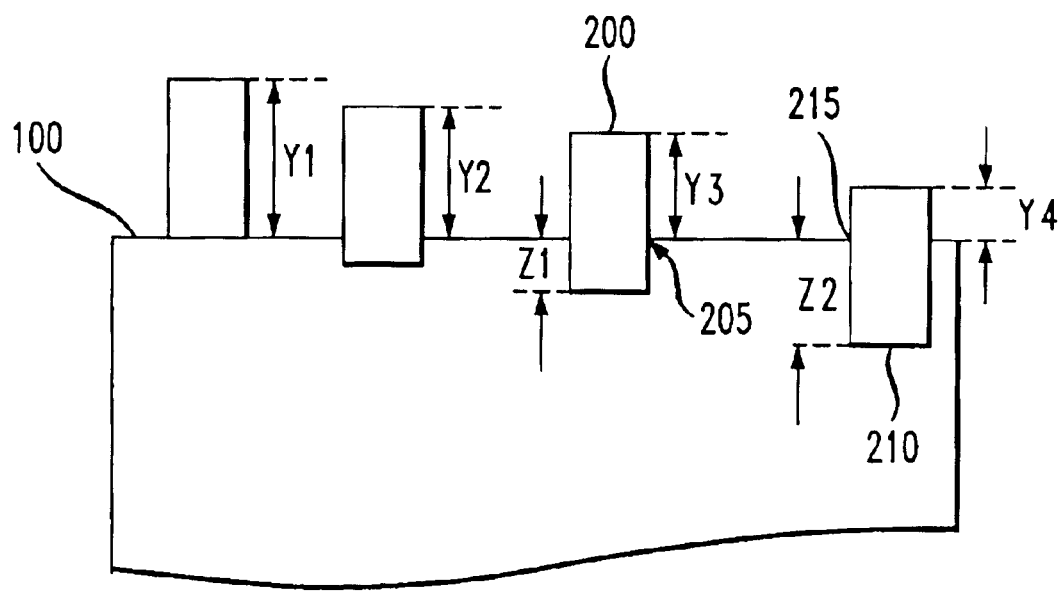
FIG. 5 is an exploded view of the integrated circuit according to a further illustrative embodiment of the present invention.

FIG. 5 illustrates a further illustrative embodiment of the present invention. In this embodiment, the heights Y1, Y2, Y3, Y4, and Y5 of the conductive regions are varied with respect to the upper surface 100 of the die 10. This may be accomplished by forming vias or openings having different depths in an underlying layer and depositing a conductive layer. The conductive layer is patterned using well-known lithography and etching techniques. Multiple etching and lithography steps may be used to form the variable height conductors. Similarly, multiple etching and lithography steps may be used to form the variable depth openings or vias.

The variable height conductive regions accentuate the stress on the conductive regions at different locations along the heights of the different conductive regions. For example, stresses will be exerted on conductive region 200 at region 205 or at a height of Z1 from the bottom of the conductive region 200. This is different from conductive region 210 where the conductive region extends beyond the via at a different height Z2 than the conductive region 210. Stresses will be exerted on conductive region 210 at region 215. As a result, differences that may cause failure in the materials forming the conductive regions such as those caused by material gradients in the conductive runners may be identified.

For example, consider conductive regions that are formed from copper. Dopants are incorporated in the copper (Cu) films from electroplating baths or can be deliberately co-plated. Typically, dopants include brighteners (e.g., propane sulfonic acid derivatives), carriers (e.g., polyalkylene glycols), levelers (e.g., sulfonated alkanes with amine, amide, disulfide functional groups), and chloride ions. The dopants naturally form gradients along the thickness of the copper films, as they are grown. Carbon can be one of the most conspicuous elements present in copper films after electroplating. The concentration of carbon usually increases from top to bottom of the copper film. The presence of these additional elements and materials in a copper film, particularly if they vary across the thickness of the film, may cause weak spots in the copper film. The embodiment shown in FIG. 5 provides a mechanism to focus stress on potential weak spots in the conductive regions to assess whether the conductive regions have failed or are likely to fail.

Figure 6:
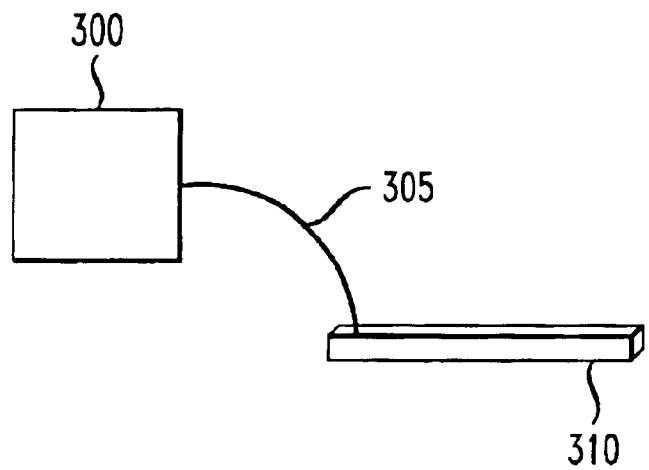
FIG. 6 is a block diagram of an integrated circuit under test according to an illustrative embodiment of the present invention.

FIG. 6 is a block diagram illustrating an integrated circuit 310 including conductive regions 30a, 30b, and 30c under test using a tester 300. The tester includes probes 305 that are coupled to bond pads for testing the conductive regions 30a, 30b, and 30c.

Although the invention has been described with reference to exemplary embodiments, it is not limited to those embodiments. Rather, the appended claims should be construed to include other variants and embodiments of the invention that may be made by those skilled in the art without departing from the true spirit and scope of the present invention.

What is claimed is:

1. An integrated circuit test device comprising:

a substrate having an integrated circuit thereon and including interconnects formed within a layer on said substrate;

a plurality of bond pads formed about an outer region of said substrate; and a conductive trace formed on said layer and coupled to at least two of said plurality of bond pads, said conductive trace and said at least two of said plurality of bond pads electrically isolated tom said integrated circuit and said interconnects.

2. The integrated circuit test device of claim 1 wherein said conductive trace surrounds said plurality of bond pads.

3. The integrated circuit test device of claim 2 wherein said conductive trace has a chamfered region.

4. The integrated circuit test device of claim 1 further comprising at least two separate conductive traces.

5. The integrated circuit test device according to claim 4 wherein said at least two separate conductive traces have a varying height relative to an upper surface of said substrate.

6. The integrated circuit test device according to claim 1 wherein said conductive trace is formed at the periphery of said integrated circuit.

7. The integrated circuit test device of claim 1 further comprising at least two separate isolated conductive traces, each of said separate isolated conductive traces coupled to at least two of said plurality of bond pads.

8. An integrated circuit test device comprising:

a substrate having an integrated circuit thereon and including interconnects formed within a layer on said substrate;

a plurality of bond pads formed about an outer region of said substrate; and a conductive test circuit on said substrate, including a conductive trace formed on said layer and electrically coupled to at least two of said plurality of bond pads, said conductive test circuit electrically isolated from said integrated circuit and said interconnects.

9. The integrated circuit test device of claim 8 further comprising a plurality of conductive traces.

10. The integrated circuit test device according to claim 9 wherein at least two of said plurality of conductive traces have a varying height relative to an upper surface of said substrate.

11. The integrated circuit test device of claim 8 wherein said conductive trace has a chamfered region.

\* \* \* \* \*